(12) United States Patent
Lee et al.

(10) Patent No.: US 9,747,980 B2
(45) Date of Patent: Aug. 29, 2017

(54) SEMICONDUCTOR MEMORY DEVICE AND METHOD FOR TEMPERATURE COMPENSATION USING TEMPERATURE-RESISTANCE-VOLTAGE FUNCTIONS

(71) Applicant: MACRONIX INTERNATIONAL CO., LTD., Hsinchu (TW)

(72) Inventors: Ming-Hsiu Lee, Hsinchu (TW); Yu-Hsuan Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/139,367

(22) Filed: Apr. 27, 2016

(65) Prior Publication Data

US 2017/0206954 A1 Jul. 20, 2017

Related U.S. Application Data

(60) Provisional application No. 62/279,856, filed on Jan. 18, 2016, provisional application No. 62/281,756, filed on Jan. 22, 2016.

(51) Int. Cl.
*G11C 13/00* (2006.01)

(52) U.S. Cl.
CPC ........ *G11C 13/004* (2013.01); *G11C 13/0004* (2013.01); *G11C 13/0007* (2013.01)

(58) Field of Classification Search
CPC .............. G11C 13/004; G11C 13/0007; G11C 13/0004
See application file for complete search history.

(56) References Cited

U.S. PATENT DOCUMENTS

| | | | | |
|---|---|---|---|---|
| 2009/0091979 A1* | 4/2009 | Shalvi | ..................... | G11C 11/56 365/185.09 |
| 2010/0074014 A1* | 3/2010 | Dunga | ..................... | G11C 7/04 365/185.17 |
| 2011/0080775 A1* | 4/2011 | Bae | ......................... | G11C 7/04 365/163 |

(Continued)

OTHER PUBLICATIONS

Lee, et al.: "A Low-cost, Forming-free WOx ReRAM Using Novel Self-aligned Photo-induced Oxidation"; 978-1-4799-2306-9/13/ $31.00 © 2013 IEEE; pp. 20.7.1-20.74.

(Continued)

*Primary Examiner* — Vanthu Nguyen
*Assistant Examiner* — Jerome Leboeuf
(74) *Attorney, Agent, or Firm* — McClure, Qualey & Rodack, LLP (57) ABSTRACT

A semiconductor device includes: a physical parameter sensing circuit configured to sense a variation of a physical parameter; an applying parameter generating circuit coupled to the physical parameter sensing circuit, configured to adjust an applying parameter from the variation of the physical parameter based on a transfer function which defines relationship between the physical parameter and the applying parameter; and a main circuit, coupled to the physical parameter sensing circuit and the applying parameter generating circuit, wherein the applying parameter generated by the applying parameter generating circuit is used to compensate effect on operations of the main circuit caused by the variation of the physical parameter.

11 Claims, 8 Drawing Sheets

(56) References Cited

U.S. PATENT DOCUMENTS

2012/0230103 A1* 9/2012 Choe .................. G11C 16/0483
  365/185.2
2015/0049536 A1* 2/2015 Oh ....................... G11C 13/003
  365/148

OTHER PUBLICATIONS

Tseng, et al.: "Electron Trapping Effect on the Switching Behavior of Contact RRAM Devices through Random Telegraph Noise Analysis"; 978-1-4244-7419-61101$26.00 © 2010 IEEE; pp. 28.5.1-28.5.4.

Hsu, et al.: "Study of Array Resistance Distribution and a Novel Operation Algorithm for WOx ReRAM Memory"; Extended Abstracts of the 2015 International Conference on Solid State Devices and Materials, Sapporo, 2015, pp. 1168-1169.

Chien, et al.: "A Multi-Level 40nm WOX Resistive Memory with Excellent Reliability"; 978-1-4577-0505-2/11/$26.00.© 2011 IEEE; pp. 31.5.1-31.5.4.

Grinberg, et al.: "Space-Charge-Limited Current in a Film"; IEEE Transactions on Electron Devices, vol. 36. No. 6, Jun. 1989; pp. 1162-1170.

P.N. Murgatroyd: "Theory of space-charge-limited current enhanced by Frenkel effect"; J. Phys. D: Appl. Phys., 1970, vol. 3. Printed in Great Britain; pp. 151-156.

Yu, et al.: "Conduction mechanism of TiN/HfOx/Pt resistive switching memory: A trap-assisted-tunneling model"; Applied Physics Letters 99, 063507 (2011); American Institute of Physics; pp. 1-3.

Lin, et al.: "Excellent Resistance Variability Control of WOx ReRAM by a Smart Writing Algorithm"; Department of Electronics Engineering and Institute of Electronics; pp. 1-2.

Thomas Kuglestadt: "Semiconductor Temperature Sensors Challenge Precision RTDs and Thermistors in Building Automation"; Texas Instruments Application Report; Apr. 2015; pp. 1-11.

* cited by examiner

SEMICONDUCTOR MEMORY DEVICE AND METHOD FOR TEMPERATURE COMPENSATION USING TEMPERATURE-RESISTANCE-VOLTAGE FUNCTIONS

This application claims the benefits of U.S. Provisional application Ser. No. 62/279,856, filed 2016 Jan. 18 and U.S. Provisional application Ser. No. 62/281,756, filed 2016 Jan. 22, the subject matters of which are incorporated herein by reference.

BACKGROUND OF THE INVENTION

Field of the Invention

The invention relates in general to a semiconductor device and a compensation method therefore.

Description of the Related Art

Semiconductor memory devices are important in modern electronic devices. Semiconductor memory devices have many types. Resistance change memory device is one of the types of the semiconductor memory devices. Resistance change memory device includes phase change memory (PCM) device and transition metal oxide (TMO) resistive memory. Data storage into the resistance change memory device is achieved by changing the resistance of the resistance change memory device.

The resistance of the resistance change memory device is a temperature function. That is, the resistance of the resistance change memory device is affected by the temperature of the memory device.

Usually, if the device temperature is high, the sensing window of the resistance change memory device may be reduced. As for the resistance distribution of a plurality of memory cells, at high temperature, the sensing window may even disappear, which results in read fail.

Figure 1:
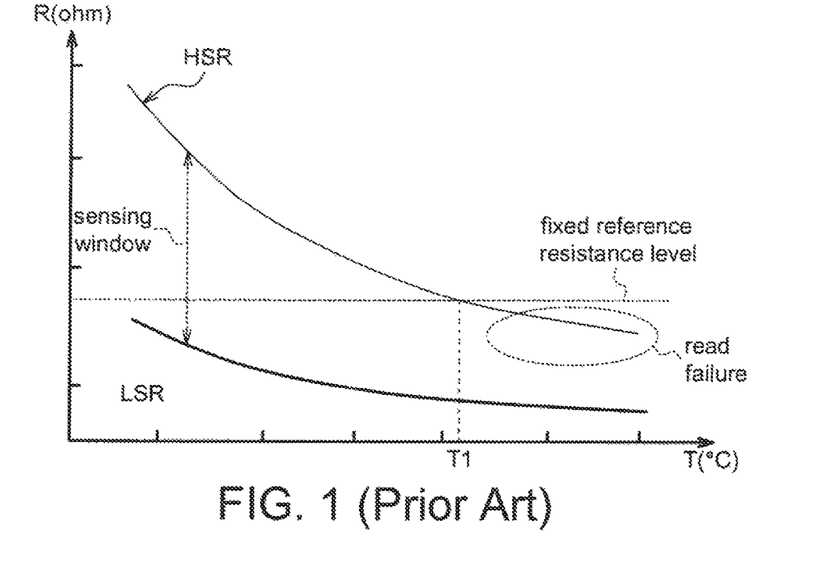
FIG. 1 (prior art) shows a relationship between resistance and temperature in applying a fixed reading bias voltage, wherein the reference resistance level is fixed.

FIG. 1 (prior art) shows a relationship between resistance and temperature in applying a fixed reading bias voltage, wherein the reference resistance level is fixed. If the resistance is higher than the reference resistance level, then the memory cell is determined to be at a high resistance state, for example, a reset state. The high resistance state refers to that the memory cell stores logic 1. On the contrary, if the resistance is lower than the reference resistance level, then the memory cell is determined to be at a low resistance state, for example, a set state. The low resistance state refers to that the memory cell stores logic 0.

The sensing window exists between the high resistance state and the low resistance state. As shown in FIG. 1, if the temperature is high, the sensing window may be narrow. If the temperature is higher than the temperature threshold T1, data reading is failed. The reason is as follows. In sensing the memory cell which had been programmed as high resistance state, the sensed resistance of the memory cell is lower than the reference resistance level if the temperature is over the temperature threshold T1. Therefore, the memory cell is mistakenly determined as low resistance state.

Figure 2:
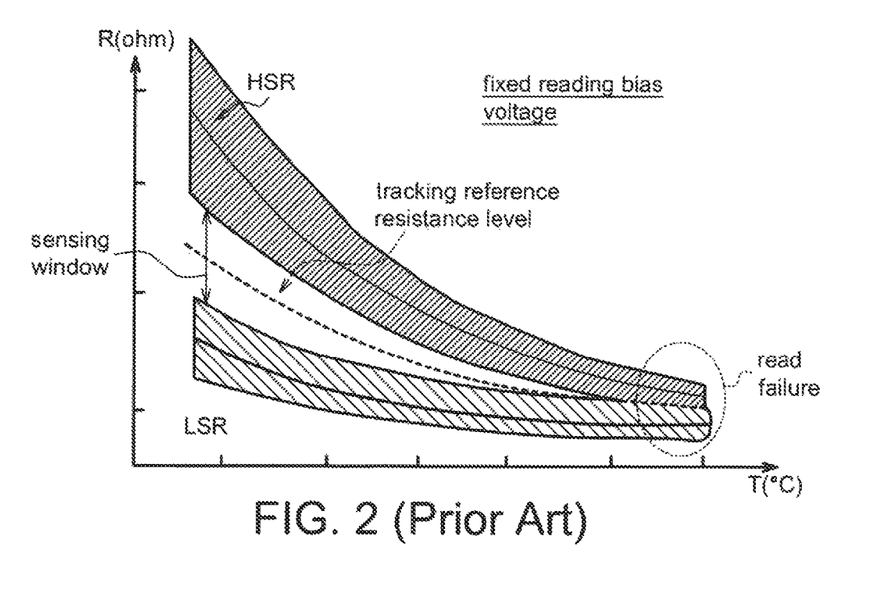
FIG. 2 (prior art) shows the resistance-temperature relationship by applying a fixed reading bias voltage, wherein the reference state level is tracking.

FIG. 2 (prior art) shows the resistance-temperature relationship by applying a fixed reading bias voltage, wherein the reference state level is tracking. The tracking reference state level may track the high resistance state and the low resistance state. However, if the temperature is high, the high resistance state and the low resistance state will be overlapped and thus the reading is failed.

Figure 3:
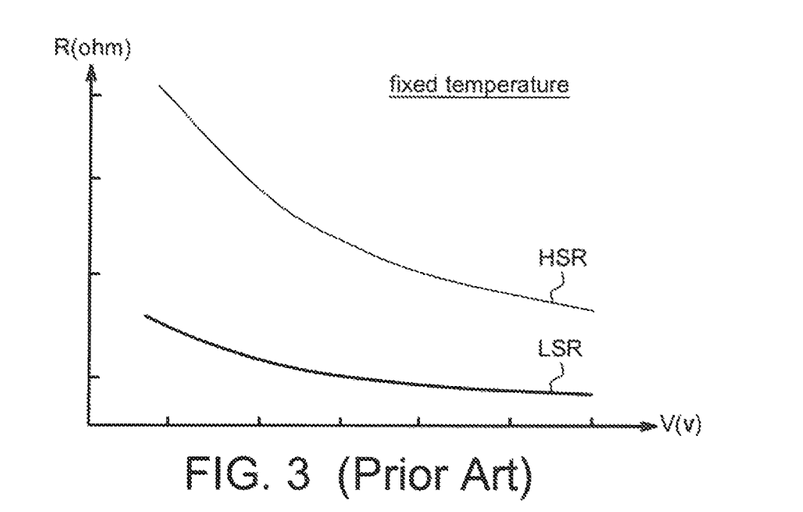
FIG. 3 (prior art) shows the resistance of the resistance change memory device and the applied reading bias voltage under fixed temperature.

Another characteristic of the resistance change memory device is that, the resistance is a function of the reading bias voltage. That is, the resistance thereof is related to the applied reading bias voltage. FIG. 3 (prior art) shows the resistance of the resistance change memory device and the applied reading bias voltage under fixed temperature. At the same temperature, if the applied reading bias voltage is lower, the resistance is higher; and vice versa.

The application discloses a semiconductor device and a compensation method therefore, which compensates negative effects by considering the relationship between the resistance and the temperature, and the relationship between the resistance and the reading bias voltage.

SUMMARY OF THE INVENTION

The invention is directed to a semiconductor device and a compensation method therefore which changes the reading bias voltage based on the temperature of the semiconductor device.

According to one embodiment of the present invention, a semiconductor device is provided. The semiconductor device includes a physical parameter sensing circuit, an applying parameter generating circuit and a main circuit. The physical parameter sensing circuit is configured to sense a variation of a physical parameter. The applying parameter generating circuit is coupled to the physical parameter sensing circuit, and is configured to adjust an applying parameter from the variation of the physical parameter based on a transfer function which defines relationship between the physical parameter and the applying parameter. The main circuit is coupled to the physical parameter sensing circuit and the applying parameter generating circuit. The applying parameter generated by the applying parameter generating circuit is used to compensate effect on operations of the main circuit caused by the variation of the physical parameter.

According to another embodiment of the present invention, a method compensation method for a semiconductor device is provided. A variation of a physical parameter is sensed. From the variation of the physical parameter, an applying parameter is adjusted based on a transfer function which defines relationship between the physical parameter and the applying parameter. Effect on operations of the main circuit caused by the variation of the physical parameter is compensated based on the applying parameter.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Technical terms of the disclosure are based on general definition in the technical field related to the disclosure. If the disclosure describes or explains one or some terms, definition of the terms are based on the description or explanation of the disclosure. Details of common technologies or theories in the related technical field are omitted in the following description if they do not involve technical features of this disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

In embodiments of the application, different reading bias voltage is applied under different temperature. That is, the reading bias voltage is a function of the temperature. For example, under high temperature, if the reading bias voltage is fixed, then the sensing window is reduced in prior art. However, in the embodiments of the application, under high temperature, a lower reading bias voltage is applied and thus the sensing window may be kept from being reduced. By this, the resistance distribution of two adjacent memory states is not overlapped.

Figure 4:
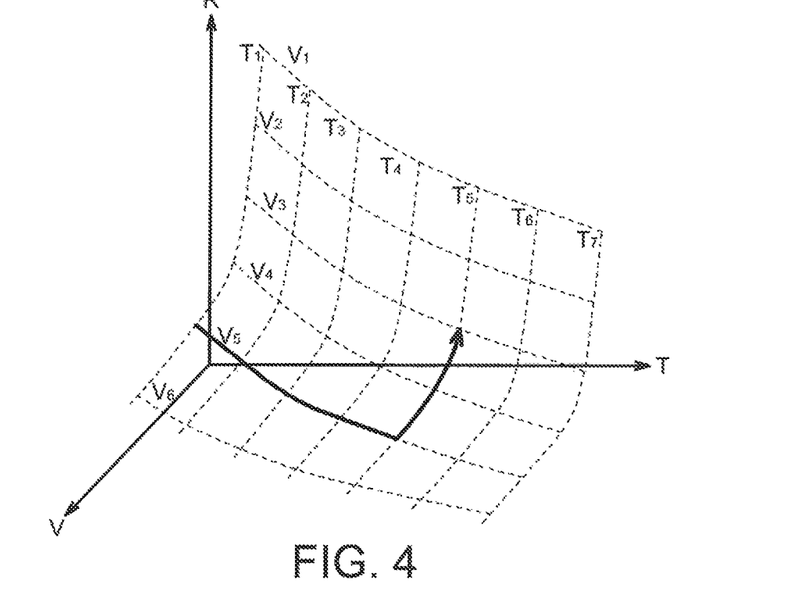
FIG. 4 shows a 3D curve plot between the resistance (R), the temperature (T) and the reading bias voltage (V) according to the embodiment of the application.

FIG. 4 shows a 3D curve plot between the resistance (R), the temperature (T) and the reading bias voltage (V) according to the embodiment of the application. In FIG. 4, the reference symbols $T_1$-$T_7$ and $V_1$-$V_6$ refer to the temperature and the reading bias voltage. Assume that the current reading bias voltage is $V_5$ and the temperature is $T_1$. If the temperature is changed from $T_1$ to $T_5$, the resistance value of the memory cell is reduced. In order to prevent the sensing window from being reduced due to the high temperature, in the embodiment of the application, the reading bias voltage is reduced from $V_5$ to $V_3$ for increasing the resistance of the memory cell. That is to say, even if the temperature is changed from $T_1$ to $T_5$, the variation in the resistance is also reduced to keep the width of the sensing window or to prevent the sensing window from being reduced.

Figure 5:
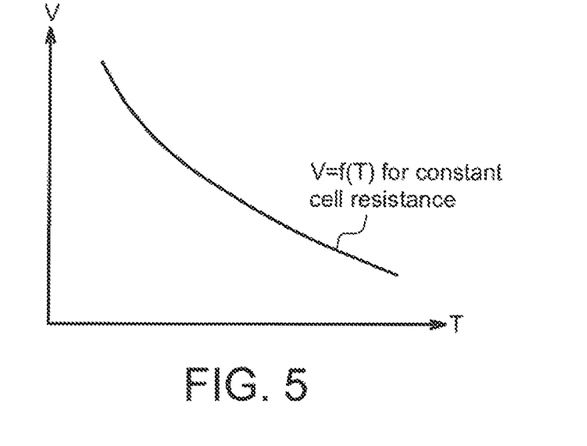
FIG. 5 shows a transfer function V=f(T) under a constant resistance.

Further, in the embodiment of the application, the transfer function between the reading bias voltage and the temperature is defined. The transfer function defines the reading bias voltage under the operation temperature. FIG. 5 shows a transfer function V=f(T) under a constant resistance, wherein V and T refer to the reading bias voltage and the temperature. That is, to keep the resistance of the memory cell, when the temperature is changed, the desired reading bias voltage may be obtained based on the transfer function.

If the memory cell includes a memory element and a switch (or a selector, for example but not limited by, a transistor), the transfer function may include the temperature effect of the memory element and/or the selector.

Figure 6A:
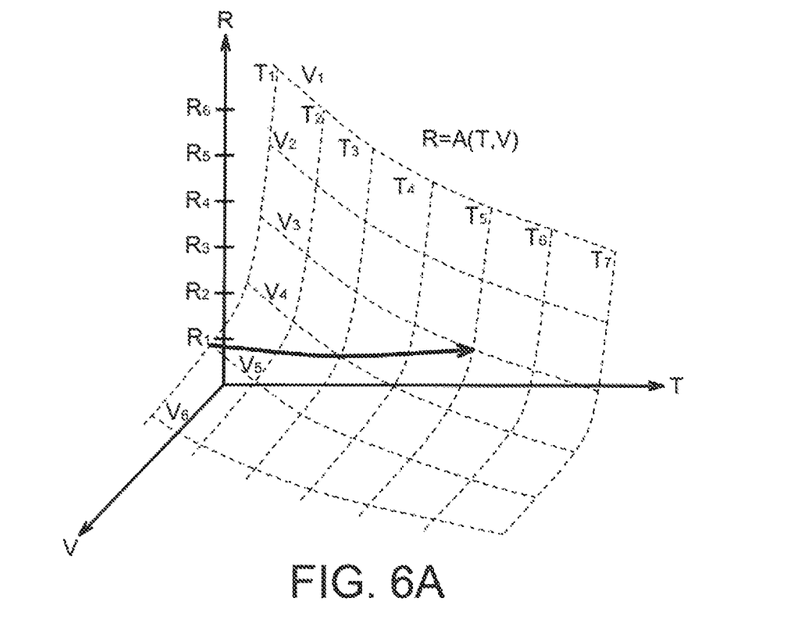
FIG. 6A shows a relationship between the temperature, the resistance and the reading bias voltage in an embodiment of the application.

FIG. 6A shows a relationship between the temperature, the resistance and the reading bias voltage in an embodiment of the application. As shown in FIG. 6A, in the embodiment of the application, if the temperature is changed, the desired reading bias voltage may be obtained based on the transfer function. Even when the temperature is changed, the resistance of the memory cell is also kept to prevent the resistance variation due to temperature change and to prevent the sensing window from being reduced due to temperature change.

Figure 6B:
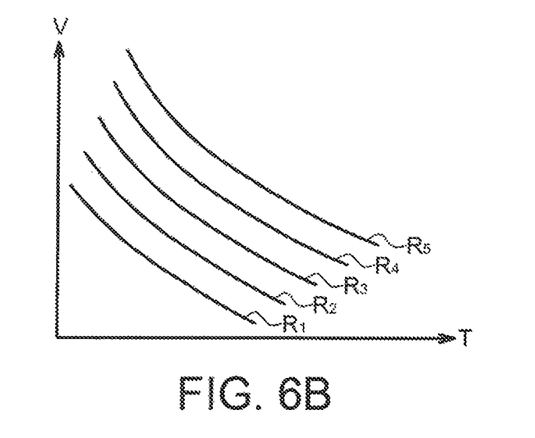
FIG. 6B shows the relationship between the temperature, the resistance and the reading bias voltage in FIG. 6A.

FIG. 6B shows the relationship between the temperature, the resistance and the reading bias voltage in FIG. 6A. From FIG. 6B, under different resistance $R_1$-$R_5$, the transfer function defining the temperature and the reading bias voltage is different.

Figure 7:
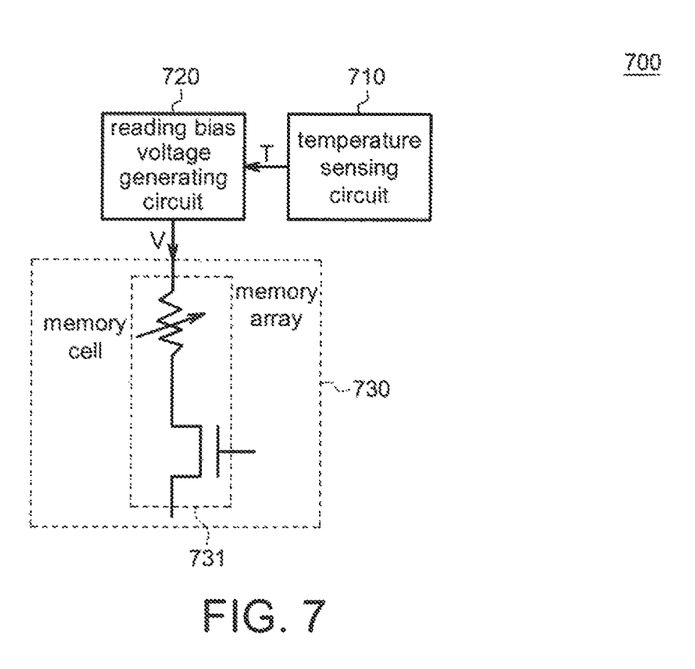
FIG. 7 shows a block diagram of the semiconductor memory device according to an embodiment of the application.

FIG. 7 shows a block diagram of the semiconductor memory device according to an embodiment of the application. The semiconductor memory device 700 according to the embodiment of the application includes a temperature sensing circuit 710, a reading bias voltage generating circuit 720 and a memory array 730. The memory array 730 includes a plurality of memory cells 731. The memory array 730 may be a main circuit of the semiconductor memory device 700.

The temperature sensing circuit 710 may sense the temperature of the semiconductor memory device 700 and sends an electrical signal (a voltage signal or a current signal) representing the sensed temperature T to the reading bias voltage generating circuit 720.

The temperature sensing circuit 710 may be implemented by an internal semiconductor temperature sensor, for example, PN-junction diode or BJT (bipolar junction transistor) whose output parameter is a coefficient of the temperature. The output parameter may include a voltage parameter, a current parameter, a pulse waveform parameter or a pulse timing parameter. Thus, the temperature may be sensed or detected from detection of the output parameter. Alternatively, in other possible embodiments of the application, the temperature sensing circuit 710 may be implemented by an external semiconductor temperature sensor.

Still further, the temperature sensing circuit 710 may be implemented by a PTAT (proportional to absolute temperature) bandgap temperature sensor.

Still further, the temperature sensing circuit 710 may be implemented by a PTAT bandgap temperature sensor and a VCVS (voltage controlled voltage source). The VCVS may be for example but not limited by, an operation amplifier and a resistor string.

The reading bias voltage generating circuit 720 may generate the desired reading bias voltage V from the temperature T sensed by the temperature sensing circuit 710, based on the transfer function (as shown in FIG. 4, FIG. 5, FIG. 6A and FIG. 6B). The reading bias voltage V may be applied to the selected memory cells 731 of the memory array 730. As described above, the transfer function may be defined based on relationship between the temperature, the resistance and the reading bias voltage of the memory cells 731.

The transfer function may link the physical parameters (for example but not limited by, temperature and/or voltage, and/or any combination thereof) with the performance/characteristic (for example but not limited by, memory cell resistance, and/or the output current and/or the threshold voltage, and/or any combination thereof) of the semiconductor device.

In FIG. 7, for simplicity, the memory cell 731 includes a memory element and a selector. The selector includes for example but not limited by, MOS transistor, BJT, pn-junction diode, OTS (Ovonic Threshold Switching) device or other similar devices. In other possible embodiments of the application, the memory cell 731 may a self-selecting memory element, that is, the memory cell 731 does not include the selector. The memory cell 731 may be implemented by, for example but not limited by, the phase change memory, the TMO ReRAM, the conduction bridge RAM, or the Magnetoresistive Random Access Memory (MRAM).

Figure 8:
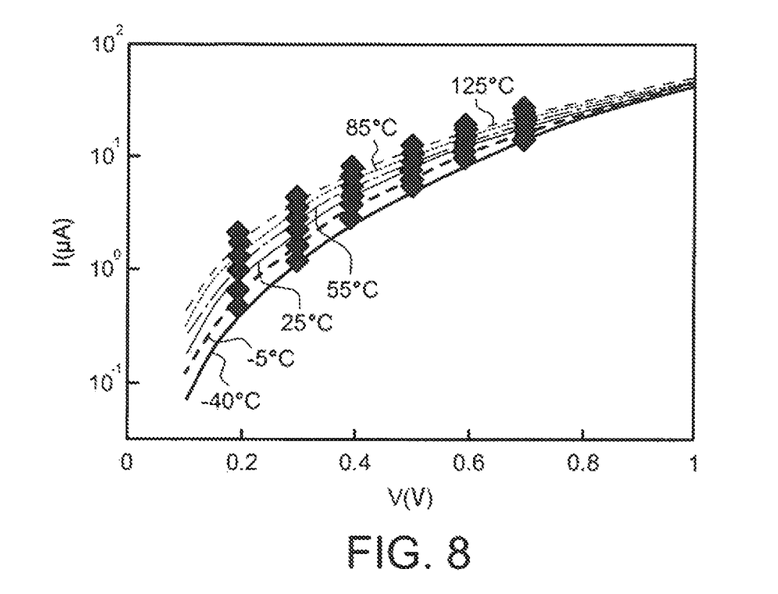
FIG. 8 shows an experiment data chart of the embodiment of the application.

FIG. 8 shows an experiment data chart of the embodiment of the application. FIG. 8 shows the current-voltage relationship of a single memory cell under different temperatures. In FIG. 8, the solid dot represents the experiment data and the solid line represents the model data. As shown in FIG. 8, the experiment data of the embodiment matches with the model data.

Figure 9:
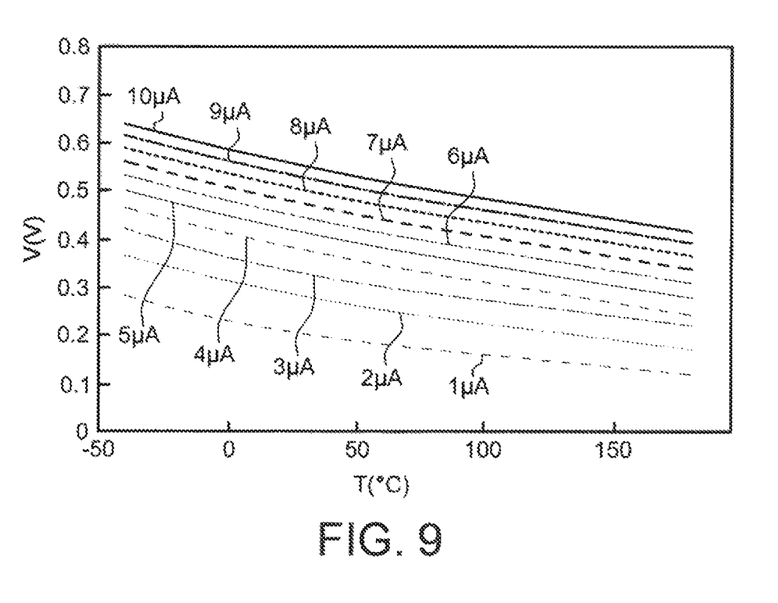
FIG. 9 shows the relationship between the reading bias voltage and the temperature for a single memory cell according to the embodiment of the application.

FIG. 9 shows the relationship between the reading bias voltage and the temperature for a single memory cell according to the embodiment of the application. From FIG. 9, in the embodiment of the application, the reading bias voltage may be changed for outputting constant reading currents (between 1 μA and 10 μA).

Figure 10:
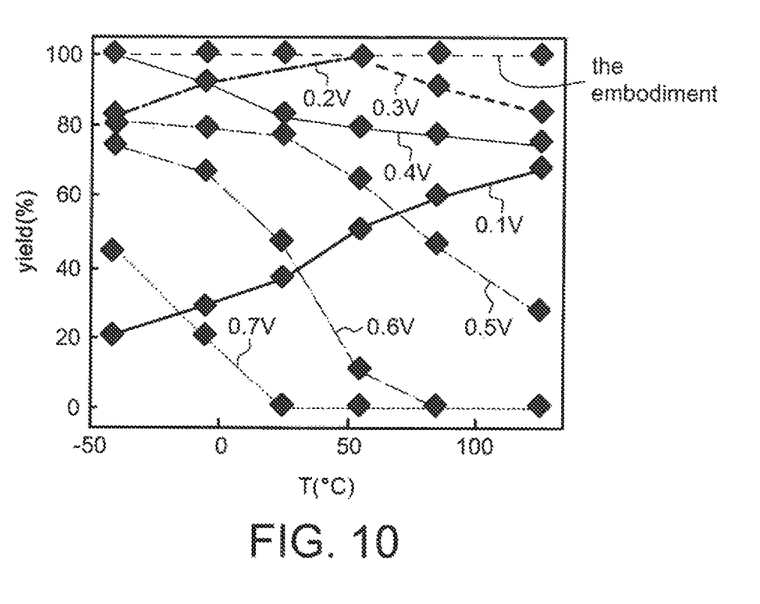
FIG. 10 shows the reading yield between the embodiment of the application (varying the reading bias voltage) and the prior art (fixing the reading bias voltage).

FIG. 10 shows comparison of the reading yield between the embodiment of the application (varying the reading bias voltage) and the prior art (fixing the reading bias voltage). As shown in FIG. 10, the prior art fixes the reading bias voltage and thus the reading yield is not maintained during the temperature (0 degree to 100 degree). For example, in case of the reading bias voltage is fixed at 0.4V, the reading yield is better at low temperature than that at high temperature. On the contrary, in the embodiment of the application, the reading yield approaches 100% at high temperature or at low temperature.

Thus, in the embodiment of the application, the temperature of the memory device is tracked/sensed to calculate the desired reading bias voltage to compensate the variation in the cell resistance due to the temperature effect.

Figure 11:
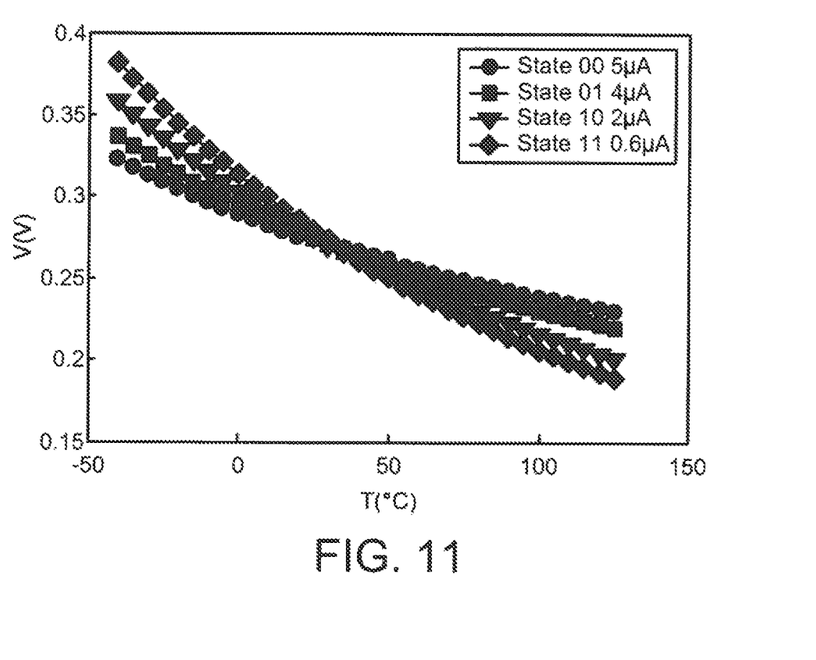
FIG. 11 shows the transfer function defining the reading bias voltage and the temperature of the MCL according to the embodiment of the application.

Besides, other possible embodiment of the application may be applied in the MLC (multi-level cell) memory device. FIG. 11 shows the transfer function defining the reading bias voltage and the temperature of the MCL according to the embodiment of the application. The memory array (for example, the memory array 730 in FIG. 7) includes a plurality of MLCs. As shown in FIG. 11, in order to output constant reading current, different memory states are corresponding to different transfer functions. By applying desired reading bias voltage at the operation temperature, the constant reading current may be obtained at each memory state.

Figure 12A:
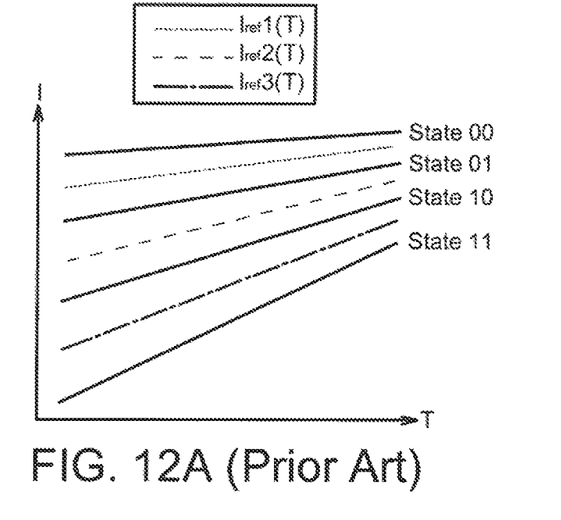
FIG. 12A (prior art) shows the relationship between the temperature and the reading current of the MLC in prior art having tracking reference resistance level.
Figure 12B:
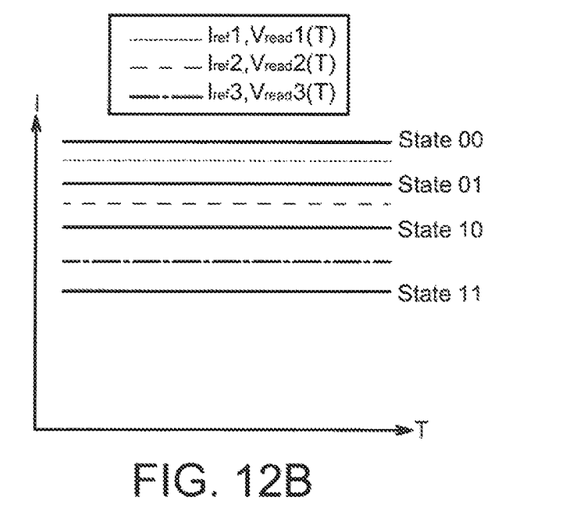
FIG. 12B shows the relationship between the temperature and the reading current of the MLC according to the embodiment of the application.

FIG. 12A shows the relationship between the temperature and the reading current of the MLC in prior art having tracking reference resistance level. FIG. 12B shows the relationship between the temperature and the reading current of the MLC according to the embodiment of the application.

From FIG. 12A, at low temperature, the prior reading speed is low because the reading current is low; and at high temperature, the sensing window is reduced. $I_{ref}1$ (T), $I_{ref}2$ (T) and $I_{ref}3$(T) refer to different reference currents which vary if the temperature is changed.

On the contrary, as shown in FIG. 12B, in the embodiment of the application, when the temperature is changed, the reading bias voltages $V_{read}1$ (T), $V_{read}2$(T) and $V_{read}3$(T) also change but the reference currents $I_{ref}1$, $I_{ref}2$ and $I_{ref}3$ does not vary. At low temperature, the reading speed according to the embodiment of the application is not slow, and at high temperature, the sensing window is kept.

Figure 13:
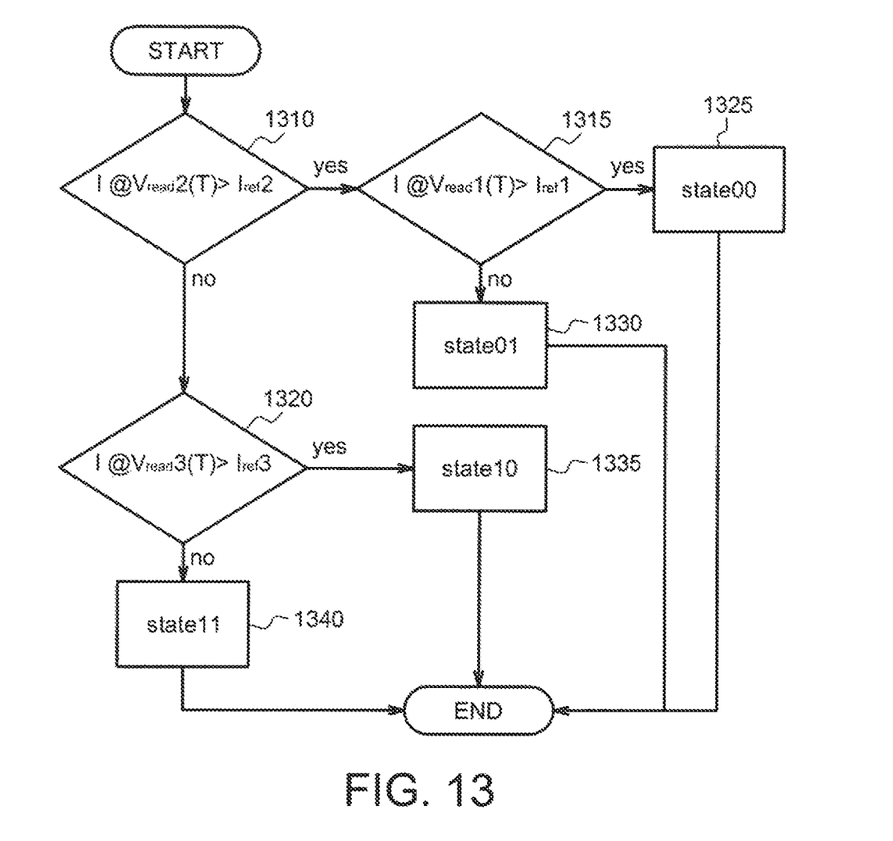
FIG. 13 shows the reading method for the semiconductor MLC memory device according to the embodiment of the application.

FIG. 13 shows the reading method for the semiconductor MLC memory device according to the embodiment of the application. In step 1310, it is judged that whether a second reading current generated when a second reading bias voltage $V_{read}2$(T) is applied is larger than a second reference current $I_{ref}2$, wherein the second reading bias voltage is a temperature function but the second reference current is fixed. If yes in step 1310, the MLC may be at state 00 or 01 (low resistance state); and if no in step 1310, the MLC may be at state 10 or 11 (high resistance state).

If yes in step 1310, the flow proceeds to the step 1315 to judge that whether a first reading current generated when a first reading bias voltage $V_{read}1$(T) is applied is larger than a first reference current $I_{ref}1$, wherein the first reading bias voltage is a temperature function but the first reference current is fixed. If yes in step 1315, the MLC is at state 00 (step 1325); and if no in step 1315, the MLC is at state 01 (step 1330).

If no in step 1310, the flow proceeds to the step 1320 to judge that whether a third reading current generated when a third reading bias voltage $V_{read}3$(T) is applied is larger than a third reference current $I_{ref}3$, wherein the third reading bias voltage is a temperature function but the third reference current is fixed. If yes in step 1320, the MLC is at state 10 (step 1335); and if no in step 1320, the MLC is at state 11 (step 1340).

Besides, the disclosure of adjusting the reading bias voltage (the applied voltage) based on the device temperature may be not only applied in the reading operations, but also in the verification steps of the reset operations and the set operations, to compensate the temperature effect.

Further, the embodiment of the application is not only applied in compensating the temperature effects. Other possible embodiments of the application may be applied in other application fields. For example, if the transfer function may link other physical parameters to sensing performance/characteristic, the embodiment of the application may be used to generate constant output.

The basic spirit and concept of the embodiment of the application may be used to adjust other types of electrical signals if the sensing parameter is a function of the applying parameter. The applying parameter may include for example but not limited by, current and the applying time. That is, in other possible embodiment of the application, the applying parameter (the current, the applying time) may be adjusted based on the sensing parameter (the temperature). This is also within the spirit and scope of the application.

The spirit of the embodiment of the application relies on that the applying parameter (if the sensing parameter is a function of the applying parameter) is controlled to compensate effect due to variation of the sensing parameter, wherein the variation of the sensing parameter may be resulted from the variation of the environment parameter (for example but not limited by, the temperature or brightness). The sensing parameter may include for example but not limited by, the cell resistance, the cell current, the nature frequency and any combination thereof. The applying parameter may include for example but not limited by, the reading bias voltage, the reading current, the applying time and any combination thereof. That is, taking FIG. 7 as an example, the temperature sensing circuit 710 is a physical parameter sensing circuit and the reading bias voltage generating circuit 720 is an applying parameter generating circuit.

As above, the compensation method for the semiconductor memory device according to the embodiment of the application may adjust the reading bias voltage based on the temperature of the semiconductor memory device, to compensate the temperature effect of the memory cell resistance. Even at high temperature, the sensing window is kept, which is helpful in data read accuracy and in development of high reliability semiconductor memory device.

Besides, in the prior art, reduction of the sensing window at high temperature negatively affects not only the data reading accuracy, but also the verification of the program operations and the erase operations. The embodiment of the application may change the reading bias voltage to prevent the verification from being negatively affected by high temperature.

In the embodiment of the application, another advantage of applying low reading bias voltage at high temperature is that the reading current is reduced which prevents reading disturbance.

Further, in the embodiment of the application, by applying low reading bias voltage at high temperature, the possibility of mistakenly conducting the unselected cells is reduced and the leakage current from the unselected cells may be also reduced.

In the embodiment of the application, the advantage of applying high reading bias voltage at low temperature is that the reading current is higher and thus, the sensing speed and the operation speed is improved.

Besides, in other possible embodiment of the application, the transfer function includes a linear function, a reciprocal function or an exponent function, which is still within the spirit of the application.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device including:
a physical parameter sensing circuit configured to sense a variation of a physical parameter;
an applying parameter generating circuit coupled to the physical parameter sensing circuit, configured to adjust an applying parameter based on the variation of the physical parameter based on a transfer function which defines a relationship between the physical parameter and the applying parameter; and
a main circuit, coupled to the physical parameter sensing circuit and the applying parameter generating circuit, wherein the main circuit comprises a plurality of memory cells each including a memory element and a selector coupled to the memory element, the transfer function comprises a temperature effect of the memory element and/or the selector,
wherein the applying parameter generated by the applying parameter generating circuit is used to compensate effects on operations of the main circuit caused by the variation of the physical parameter,
wherein if the physical parameter sensing circuit senses that a temperature is changed from a lower temperature to a higher temperature, the applying parameter generating circuit generates a lower reading bias voltage to a bit line coupled to one of the plurality of the memory cells and the same reference current for deciding a state of the one of the plurality of the memory cells at the same time, the lower reading bias voltage generated by the applying parameter generating circuit to the bit line at the higher temperature is lower than a higher reading bias voltage generated by the applying parameter generating circuit to the bit line at the lower temperature.

2. The semiconductor device according to claim 1, wherein
the physical parameter sensing circuit includes a temperature sensing circuit which is either an internal or an external semiconductor temperature sensing circuit; and
an output parameter of the temperature sensing circuit is a temperature function, the output parameter including a voltage parameter, a current parameter, a pulse waveform parameter or a pulse timing parameter.

3. The semiconductor device according to claim 1, wherein the main circuit includes a plurality of multi-level cells, and for the multi-level cells, different memory states are corresponding to different transfer functions.

4. The semiconductor device according to claim 3, wherein
it is judged that whether a second reading current generated when a second reading bias voltage is applied to the bit line is larger than a second reference current, wherein the second reading bias voltage becomes lower as the temperature is increased from the lower temperature to the higher temperature but the second reference current is fixed;
if the second reading current is larger than the second reference current, it is judged that whether a first reading current generated when a first reading bias voltage is applied to the bit line is larger than a first reference current, wherein the first reading bias voltage becomes lower as the temperature is increased from the lower temperature to the higher temperature but the first reference current is fixed;
if the first reading current is larger than the first reference current, it is determined that the multi-level cell is at a first state; and vice versa, it is determined that the multi-level cell is at a second state;

if the second reading current is smaller than the second reference current, it is judged that whether a third reading current generated when a third reading bias voltage is applied to the bit line is larger than a third reference current, wherein the third reading bias voltage becomes lower as the temperature is increased from the lower temperature to the higher temperature but the third reference current is fixed; and if the third reading current is larger than the third reference current, it is determined that the multi-level cell is at a third state; and vice versa, it is determined that the multi-level cell is at a fourth state.

5. The semiconductor device according to claim 1, wherein
the transfer function includes a linear function, a reciprocal function or an exponential function.

6. A compensation method for a semiconductor device including:
sensing a variation of a physical parameter comprising a temperature of a main circuit comprising a plurality of memory cells each comprising a memory element and a selector coupled to the memory element;
adjusting an applying parameter comprising a reading bias voltages applied to a bit line coupled to one of the plurality of the memory cells based on the variation of the physical parameter based on a transfer function which defines a relationship between the physical parameter and the applying parameter, wherein the transfer function comprises a temperature effect of the memory element and/or the selector; and
compensating effects on operations of the main circuit based on the applying parameter due to the variation of the physical parameter, wherein
if the temperature of the main circuit is sensed to change from a lower temperature to a higher temperature, the applying parameter is adjusted to generate a lower reading bias voltage to the bit line coupled to the one of the plurality of the memory cells and the same reference current for deciding a state of the one of the plurality of the memory cells at the same time, the lower reading bias voltage applied to the bit line at the higher temperature is lower than a higher reading bias voltage applied to the bit line at the lower temperature.

7. The compensation method for the semiconductor device according to claim 6, wherein
the semiconductor device includes a plurality of multi-level cells, and for the multi-level cells, different memory states are corresponding to different transfer functions.

8. The compensation method for the semiconductor device according to claim 7, wherein
it is judged that whether a second reading current generated when a second reading bias voltage is applied to the bit line is larger than a second reference current, wherein the second reading bias voltage becomes lower as the temperature is increased from the lower temperature to the higher temperature but the second reference current is fixed;

if the second reading current is larger than the second reference current, it is judged that whether a first reading current generated when a first reading bias voltage is applied to the bit line is larger than a first reference current, wherein the first reading bias voltage becomes lower as the temperature is increased from the lower temperature to the higher temperature but the first reference current is fixed;

if the first reading current is larger than the first reference current, it is determined that the multi-level cell is at a first state; and vice versa, it is determined that the multi-level cell is at a second state;

if the second reading current is smaller than the second reference current, it is judged that whether a third reading current generated when a third reading bias voltage is applied to the bit line is larger than a third reference current, wherein the third reading bias voltage becomes lower as the temperature is increased from the lower temperature to the higher temperature but the third reference current is fixed; and if the third reading current is larger than the third reference current, it is determined that the multi-level cell is at a third state; and vice versa, it is determined that the multi-level cell is at a fourth state.

9. The compensation method for the semiconductor device according to claim 6, wherein
the transfer function includes a linear function, a reciprocal function or an exponential function.

10. The semiconductor device according to claim 4, wherein:
the second reading bias voltage is lower than the first reading bias voltage and higher than the third reading bias voltage;
the second reference current is lower than the first reference current and higher than the third reference current;
the first state means the multi-level cell is at a state 00, the second state means the multi-level cell is at a state 01, the third state means the multi-level cell is at a state 10, and the fourth state means the multi-level cell is at a state 11.

11. The compensation method for the semiconductor device according to claim 8, wherein:
the second reading bias voltage is lower than the first reading bias voltage and higher than the third reading bias voltage;
the second reference current is lower than the first reference current and higher than the third reference current;
the first state means the multi-level cell is at a state 00, the second state means the multi-level cell is at a state 01, the third state means the multi-level cell is at a state 10, and the fourth state means the multi-level cell is at a state 11.

* * * * *